United States Patent [19]

Toyoda

[11] Patent Number: 5,406,121
[45] Date of Patent: Apr. 11, 1995

[54] SEMICONDUCTOR DEVICE HAVING IMPROVED INTERCONNECTION WIRING STRUCTURE

[75] Inventor: Shuji Toyoda, Tokyo, Japan

[73] Assignee: NEC Corporation, Tokyo, Japan

[21] Appl. No.: 99,598

[22] Filed: Jul. 30, 1993

[30] Foreign Application Priority Data

Jul. 31, 1992 [JP] Japan .................................. 4-225178

[51] Int. Cl.⁶ ..................... H01L 23/48; H01L 29/46; H01L 29/54; H01L 29/62
[52] U.S. Cl. .................................. 257/740; 257/765; 257/771; 257/637
[58] Field of Search ............... 257/752, 740, 635, 637, 257/639, 632, 771, 765, 740

[56] References Cited

U.S. PATENT DOCUMENTS

| | | | |
|---|---|---|---|
| 4,561,009 | 12/1985 | Yonezawa et al. | 257/765 |
| 5,040,048 | 8/1991 | Yasue | 257/767 |
| 5,061,985 | 10/1991 | Meguro et al. | 257/758 |
| 5,075,762 | 12/1991 | Kondo et al. | 257/752 |

*Primary Examiner*—Andrew J. James
*Assistant Examiner*—S. V. Clark
*Attorney, Agent, or Firm*—Young & Thompson

[57] ABSTRACT

Disclosed herein is a semiconductor device having a substrate, an insulating layer covering the substrate, a plurality of wiring layer formed on the insulating layer, each wiring layer having a top surface and a side surface, and a sidewall insulating film formed on and along the side surface of each of the wiring layers. The sidewall insulating film suppresses a hillock projecting from the side surface of each wiring layer.

1 Claim, 3 Drawing Sheets

SEMICONDUCTOR DEVICE HAVING IMPROVED INTERCONNECTION WIRING STRUCTURE

BACKGROUND OF THE INVENTION

This invention relates to a semiconductor device and, more particularly, to a semiconductor device provided with a plurality of interconnection wirings arranged at a single level or a multilevel.

With scaling down of semiconductor device, not only circuit elements such as of transistors but also interconnection wirings are being scaled down. Especially, the space between the adjacent two interconnection wirings is reduced to a sub-micron level. The interconnection wirings thus formed is then subject to a thermal treatment to improve ohmic contacts between each element region and each associated wiring and between lower and upper wirings. Each interconnection wiring is made in general of aluminium (Al), and in that case the so-called hillocks occur or are produced on each wiring. The hillocks occur not only at the up-side surface of the wirings but also at the sidewall surfaces thereof. The hillocks on the sidewalls thus cause the short-circuit between the adjacent wirings.

SUMMARY OF THE INVENTION

It is therefore an object of the present invention to provide a semiconductor device in which a short-circuit between adjacent wirings due to lateral hillocks is prevented.

Another object of the present invention is to provide a method for fabricating such a semiconductor device.

According to one aspect of the present invention, a semiconductor device according to the present invention comprises a semiconductor substrate, an insulating layer covering the semiconductor substrate, a plurality of wiring layers formed on the insulating layer, each of the wiring layers having a top surface and a pair of side surfaces, a plurality of sidewall insulating film each formed on and along side surface of each wiring layer, and a passivation film formed to cover each wiring layer, each sidewall insulating film and insulating layer.

According to another aspect of the present invention, there is provided a method of fabricating a semiconductor device which comprises the steps of forming a plurality of wiring layers on an insulating layer covering a semiconductor substrate, each layer having a top surface and a pair of side surfaces, forming an insulating film on each of the wiring layers and the insulating layer, etching-back the insulating film to leave sidewall insulating films on the side surface of each wiring layer with exposing the top surface thereof, and forming a passivation film over the entire surface.

BRIEF DESCRIPTION OF THE DRAWINGS

The above-mentioned and other objects, features and advantages of this invention will become more apparent with reference to the following detailed description taken in conjunction with the accompanying drawings, wherein.

DETAILED DESCRIPTION OF THE PREFERRED EMBODIMENTS

Figure 1A:
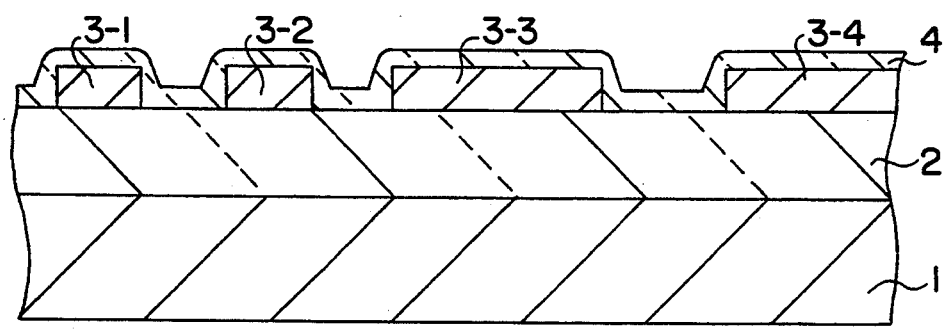
FIGS. 1A to 1D are cross-sectional views illustrative of respective steps of a method of fabricating a semiconductor device according to an embodiment of the present invention.

Referring to FIGS. 1A to 1D, there are shown the fabricating steps of a semiconductor device according to an embodiment of the present invention. This device is of a single-level aluminum wiring structure. As shown in FIG. 1A, a silicon substrate 1 has a plurality of circuit elements such as transistors, resistors and so forth (not shown) formed therein. An insulating layer 2 made of silicon dioxide is formed to cover the substrate 1. An aluminum layer is then formed on the insulating film 2 and patterned to provide a plurality of wiring layers 3-1 to 3-4. Each of the wiring layers 3 is connected to a desired circuit element region through a contact hole (not shown) provided in the layer 2. A plasma silicon oxide film 4 is thereafter deposited over the entire surface by plasma chemical vapor deposition (plasma CVD). This process is carried out at about 350° C. for a few minutes, and therefore any hillocks occur on the wiring layers 3.

Figure 1B:
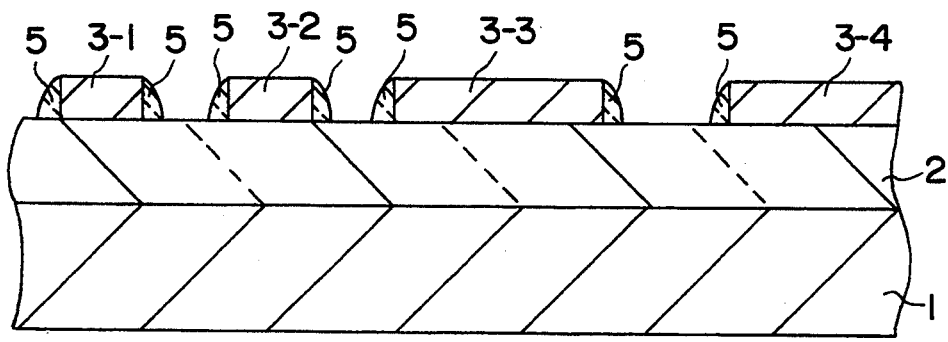

As shown in FIG. 1B, the so-called etch-back process is performed to remove the oxide film 4 until the top surface of each wiring layers 3 is exposed. As a result, sidewall silicon oxide films 5 are formed on and along each side surface of the wiring layers 3.

Figure 1C:
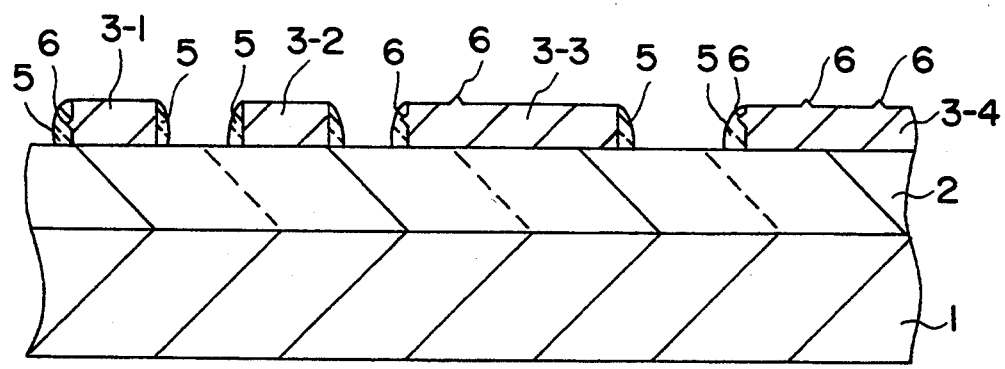

Subsequently, a thermal treatment is carried out at temperature of 400°–450° C. for 10–20 minutes to ensure the ohmic contacts between the wiring layers 3 and the element regions (not shown). By this process, hillocks 6 are produced on the wiring layers 3 as shown in FIG. 1C. The hillocks 6 occur on not only the top surface of the wiring layer 3 but also the side surface thereof. The side surface of each wiring layer 3 is, however, covered with the silicon oxide film 5, and therefore the formation of the hillocks 6 on the side surface of the wiring layer 3 is suppressed as compared to the formation thereof on the top surface of the wiring layer 3. Moreover, the oxide film 5 intervenes between the adjacent wiring layers 3. Accordingly, there is no possibility of short-circuit between the adjacent wiring layers 3.

Figure 1D:
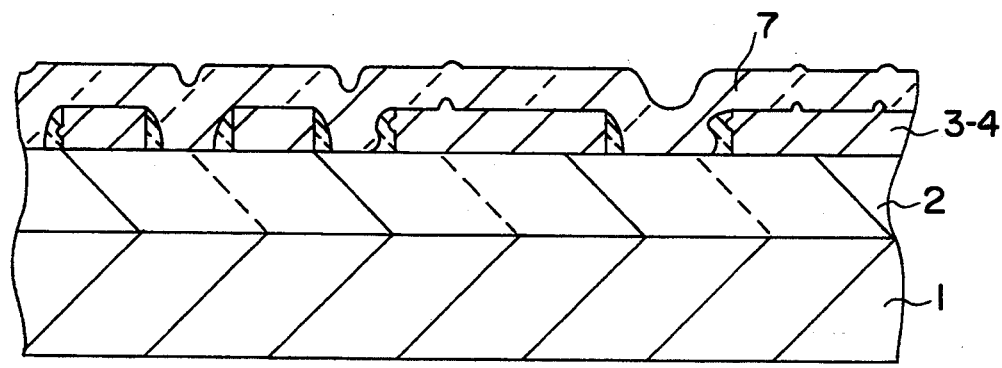

A passivation film 7 is thereafter deposited on the entire surface by the CVD method, as shown in FIG. 1D. This film is made of silicon oxynitride film.

Thus, even when the wiring layers 3 are formed with a very small space, the short-circuit therebetween due to the hillocks from the wiring layers is prevented.

The present invention is applicable to a semiconductor device of multilevel wiring structure. More specifically, as shown in FIG. 2, a silicon substrate 11 having a plurality of circuit elements (not shown) therein is covered with an insulating layer 12 made of silicon oxide. Thereafter, an aluminum layer is formed on the insulating layer 12, followed by patterning to form a plurality of wiring layers 13-1 to 13-4 at a first level of the multilevel wiring structure. Each of the wiring layers is connected to an associated one of circuit element regions (not shown) through a contact hole (also not shown) provided in the insulating film 12.

An interlayer insulating film 14 is then formed on the entire surface. This film 14 is composed of a plasma silicon oxide film 14-1, a spin-on-glass (SOG) film 14-2 and a plasma silicon oxide film 14-3. As described hereinbefore, each of the plasma silicon oxide films 14-1 and 14-3 is formed at a relatively low temperature for a few minutes. Moreover, the SOG film 14-2 is formed by coating method. Accordingly, no hillocks occur on the wiring layers 13 during the formation of the interlayer insulating film 14. The SOG film 14-2 is used to fill each hollow of the film 14-1 to thereby even out the surface of the film 14-1.

Figure 2A:
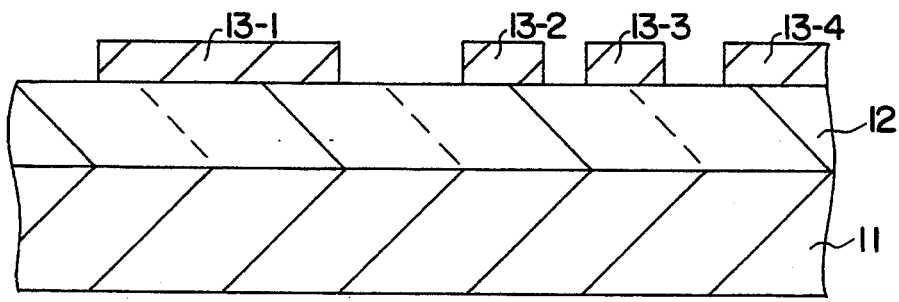
FIGS. 2A to 2E are cross-sectional views of a semiconductor chip for illustrating in sequence a fabricating process according to another embodiment of the present invention.
Figure 2B:
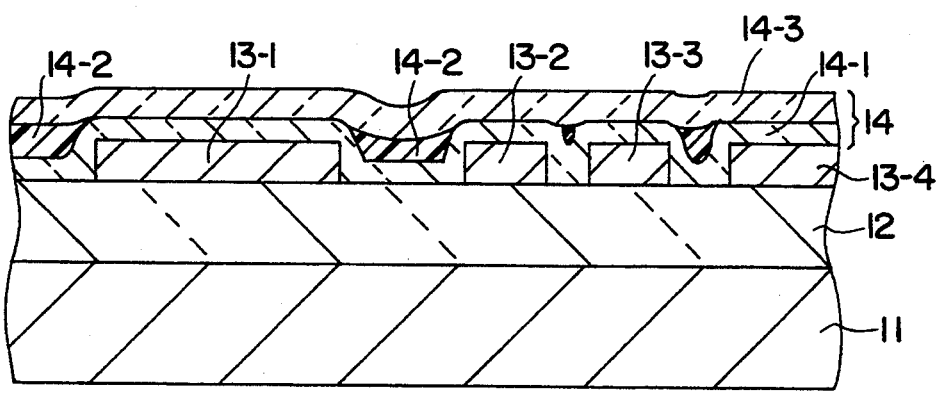
Figure 2C:
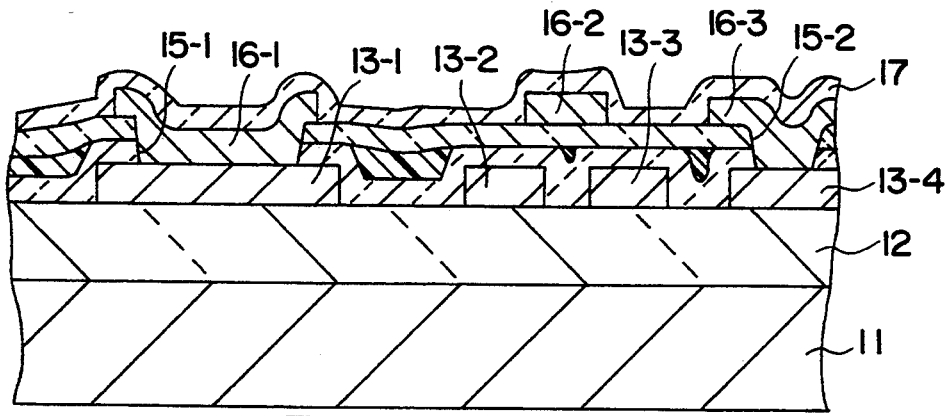

Subsequently, through holes 15-1 and 15-2 are formed in the interlayer insulating film 14 to expose the respective parts of the wiring layers 13-1 and 14-3, as shown in FIG. 2C. An aluminum layer is then formed on the entire surface, followed by patterning to form a plurality of wiring layers 16-1 to 16-3 at a second, uppermost level of the multilevel wiring structure. A plasma silicon oxide film 17 is than deposited over the entire surface.

Figure 2D:
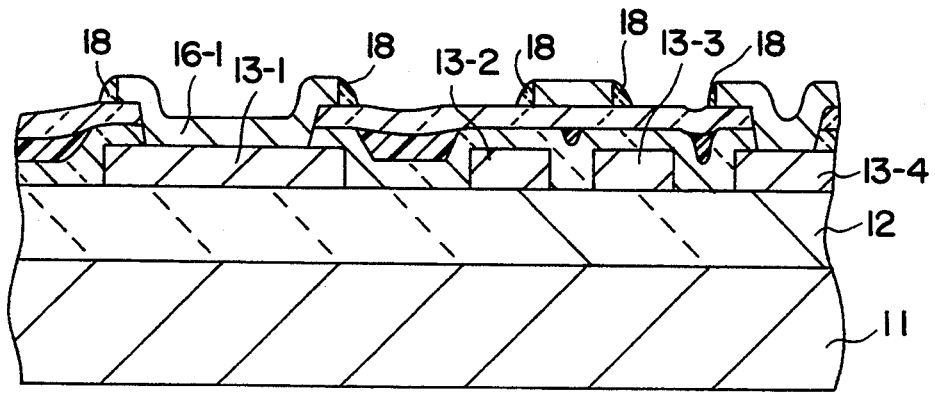

The etch-back process is then carried out to remove the film 17 until each top surface of the wiring layers 16 is exposed. As a result, sidewall insulating films 18 made of plasma silicon oxide film are formed on and along the respective side surfaces of the wiring layers 16, as shown in FIG. 2D. Thereafter, thermal treatment is performed to ensure or improve the ohmic contact between each element region and the corresponding first-level wiring layer 13 and between the first-level wiring layer 13 and the uppermost-level wiring layer 16.

Figure 2E:
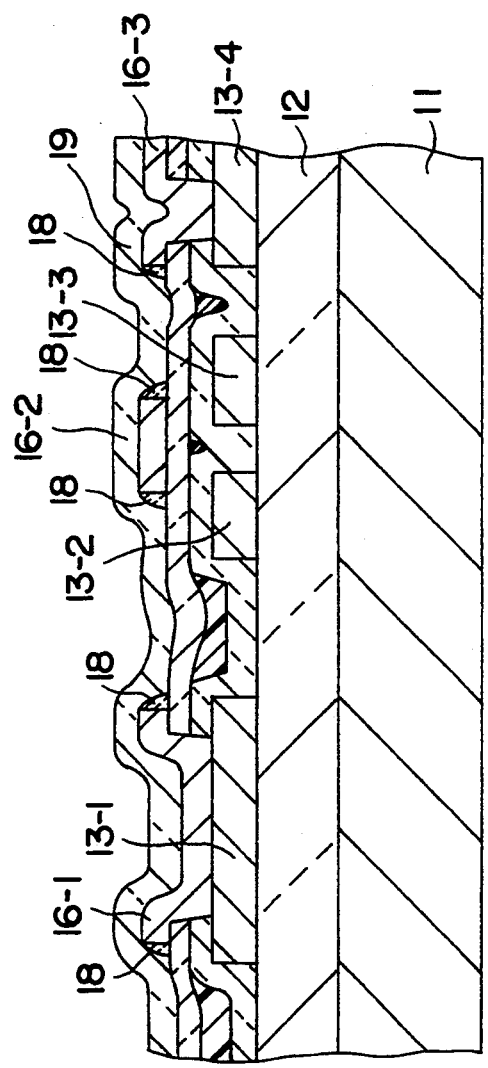

Subsequently, a passivation film 19 is deposited over the entire surface, as shown in FIG. 2E. This film 19 is made of silicon oxynitride film.

Since the interlayer insulating film 14 is formed at a relatively low temperature, no sidewall insulating film is needed to be formed on the respective side surface of the first-level wiring layer 13. If a multilevel wiring structure has more than two levels, the intermediate-level wiring layer does not need the sidewall insulating film at the side surface thereof. Only the uppermost wiring layer needs the sidewell insulating film.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will .cover any modifications or embodiments as fall within the true scope of the invention.

What is claimed is:

1. A semiconductor device having a multilevel wiring structure with wiring layers at at least a lower level and at an uppermost level, each of said wiring layers having a top surface and a side surface, said device comprising a plurality of first aluminum wiring layers at said lower level formed on an insulating layer covering a semiconductor substrate, an interlayer insulating film in contact with a side surface of each of said first wiring layers, said interlayer insulating film including a first plasma silicon oxide film having at least one hollow, a spin-on-glass film filling said at least one hollow and a second plasma silicon oxide film formed on said first plasma silicon oxide film and said spin-on-glass film, said device further comprising a plurality of second aluminum wiring layers at said uppermost level formed on said interlayer insulating film and said first wiring layers, a plurality of side wall insulating films formed on and along a side surface of each of said second wiring layers, and a passivation insulating film covering said second wiring layers and said side wall insulating films.

* * * * *